United States Patent
Paufler et al.

(10) Patent No.: US 6,844,916 B2
(45) Date of Patent: Jan. 18, 2005

(54) METHOD FOR IMPROVING IMAGE QUALITY AND FOR INCREASING WRITING SPEED DURING EXPOSURE OF LIGHT-SENSITIVE LAYERS

(75) Inventors: Jörg Paufler, Berlin (DE); Stefan Brunn, Berlin (DE); Tim Körner, Berlin (DE)

(73) Assignee: Fraunhofer Gesellschaft Zur Forderung der Angewandten Forschung E.V., Munich (DE)

( * ) Notice: Subject to any disclaimer, the term of this patent is extended or adjusted under 35 U.S.C. 154(b) by 0 days.

(21) Appl. No.: 10/380,493

(22) PCT Filed: Sep. 11, 2001

(86) PCT No.: PCT/DE01/03518
§ 371 (c)(1),
(2), (4) Date: Jul. 9, 2003

(87) PCT Pub. No.: WO02/23845
PCT Pub. Date: Mar. 21, 2002

(65) Prior Publication Data
US 2004/0017555 A1 Jan. 29, 2004

(30) Foreign Application Priority Data
Sep. 15, 2000 (DE) .......................................... 100 46 518

(51) Int. Cl.⁷ ............................................. G03B 27/42
(52) U.S. Cl. ............................. 355/53; 355/41; 355/69; 355/77; 250/492.1
(58) Field of Search .............................. 355/53, 69, 71, 355/77, 40, 41; 250/492.1

(56) References Cited

U.S. PATENT DOCUMENTS

| 5,132,723 A | 7/1992 | Gelbart |
| 5,482,818 A | 1/1996 | Nelson |
| 5,495,280 A | 2/1996 | Gehner et al. |
| 5,684,620 A | 11/1997 | Schoon |
| 5,691,541 A | 11/1997 | Ceglio et al. |
| 2002/0012110 A1 | 1/2002 | Luellau et al. |

FOREIGN PATENT DOCUMENTS

| DE | 40 07 716 A1 | 8/1991 |
| DE | 199 44 760 A1 | 3/2001 |
| EP | 0 556 591 A1 | 8/1993 |
| EP | 0 905 674 A1 | 3/1999 |
| WO | WO 93/09472 | 5/1993 |
| WO | WO 98/04950 | 2/1998 |
| WO | WO 98/29782 | 7/1998 |

OTHER PUBLICATIONS

International Search Report of PCT/DE01/03518, dated Jun. 13, 2002.
International Preliminary Examination Report of PCT/DE01/03518, dated Jan. 30, 2003.

*Primary Examiner*—D. Rutledge
(74) *Attorney, Agent, or Firm*—Christie, Parker and Hale, LLP

(57) ABSTRACT

A method for the maskless exposure of light-sensitive layers of an object for the micropatterning thereof, is disclosed. In one embodiment, at least one surface light modulator with an associated optical arrangement is irradiated by means of a light source and image fields. Individual structural elements, groups of structural elements or parts thereof are imaged with a predetermined exposure dose on the light-sensitive layer in accordance with the respective driving state of the at least one surface light modulator, the predetermined exposure dose being divided between a plurality of exposure operations. The exposure dose for the individual exposure operations is chosen in such a way that, proceeding from a predetermined minimum exposure dose, the exposure dose is increased for each exposure operation compared with the respective preceding exposure operation. The exposure dose for the last exposure operation is more than 50% of the predetermined exposure dose.

10 Claims, No Drawings

METHOD FOR IMPROVING IMAGE QUALITY AND FOR INCREASING WRITING SPEED DURING EXPOSURE OF LIGHT-SENSITIVE LAYERS

CROSS-REFERENCE TO RELATED APPLICATION

This application is a National Phase Patent Application of International Application Number PCT/DE01/03518, filed on Sep. 11, 2001, which claims priority of German Patent Application Number 100 46 518.8, filed Sep. 15, 2000.

Field

The invention relates to a method for the maskless patterning of light-sensitive layers, in particular for microelectronics, microsystems technology, thin-film technology, the production of flat screens, the direct exposure of semiconductor wafers in semiconductor production, the direct exposure of printed circuit boards and for the patterning of masks and reticles in lithographic applications.

BACKGROUND

In order to produce microelectronic components or printed circuit boards, mass production patterning methods are employed in which the structures that are to be imaged, for example on a silicon wafer for the fabrication of chips, are imaged through the use of masks, preferably made of metal-coated quartz glass. The wafer is patterned by coating its surface with a photoresist and partially exposing it, through the use of the masks. This form of patterning, known as photolithography, is a very mature technology and is therefore widespread in mass production.

When producing smaller numbers of chips, for example for test series, or when fabricating gate array circuits, the comparatively high outlay for the production of the multiplicity of masks required for fabricating a circuit has a disadvantageous effect from an economic standpoint. The fabrication of the masks can be time-consuming and costly. Added to this is the fact that new masks continually have to be designed and fabricated because of the short innovation cycles in microelectronics and the hence frequently changing production profiles of semiconductor manufacturers. Therefore, for some time there has been a transition partly toward maskless production of the corresponding structures. A technology that can be used for this is electron beam writing, for example. In this case, the radiation source, an electron beam, is driven directly in the manner required for the structure to be produced. However, this technology requires a high outlay on apparatus and, for this reason, is likewise too expensive for the production of smaller series.

WO 93/09472 specifies a technical solution in which the maskless patterning, as known from the technologies which work with masks, is effected using light. The aforementioned document describes a method and an apparatus in which the light beam emerging from a light source is modulated by surface light modulators. The light beam is guided onto an imaging element and modulated by said imaging element with regard to its areal propagation and the radiation modulated in this way is fed to the layer to be patterned.

In accordance with the solution presented in the document, the imaging element is a special mirror chip which has, below its surface, a multiplicity of microelectrodes that are arranged in a matrix and can be driven individually. The layer located beneath the chip surface of the mirror chip is deformed partially depending on the driving of said electrodes. At the deformed regions, the light emitted by the light source for patterning is diffracted, so that the light is only reflected by the non-driven regions directly and without diffraction.

By means of a suitable optical arrangement with a semi-transparent mirror and a diaphragm, all of the diffracted light components are then filtered out and only the directly reflected light is guided onto the light-sensitive layer to be patterned. As a result, a negative image of the driving state at the imaging element is produced on the light-sensitive layer. In other words, a structure corresponding to the non-driven electrodes (pixels) of the mirror chip is imaged there.

In the practical implementation of the method, the light-sensitive layer is patterned in a plurality of exposure operations. As a result, statistical influences which result for example from the energy statistics of the laser that is preferably used for the exposure, or from other statistical influences, such as undesirable alterations to the present focus position, are eliminated to the greatest possible extent. In this case, the total exposure dose (nominal exposure dose) required for producing a structural element or groups of structural elements or parts thereof is divided between the individual exposure operations.

According to a known procedure, the process for this purpose involves an exposure with 50% of the exposure dose that is required in total being effected during the first exposure operation and the exposure dose being halved in each subsequent exposure operation. Since the exposure dose that is required in total must result altogether after all of the exposure operations have been carried out, this means that it is necessary to perform the exposure operation with the lowest exposure dose (intensity) twice.

The variation of the exposure doses in the individual exposure operations is necessary for obtaining different gray-scale values of the imaging in order to achieve a predetermined addressing grid. However, each additionally required exposure operation has a disadvantageous effect with regard to the writing speed at which the structure is transferred to the light-sensitive layer. Moreover, the occurrence-which cannot be precluded—of pixel defects at the imaging element impair the image quality of the structural elements imaged on the light-sensitive layer.

Although possible solutions are already offered in respect of this in WO 93/09472, these are still not satisfactory in part with regard to the result or the outlay. Further inaccuracies or impairments of the image quality result when image fields are placed together in order to produce more extensive structures inter alia due to the finite numerical aperture of the optical arrangement.

Object

Therefore, it is an object of the invention to specify a method by which any of: the abovementioned disadvantages are avoided. In particular, the intention is to demonstrate possibilities for increasing the writing speed and/or for improving the image quality.

SUMMARY

A method for the maskless exposure of light-sensitive layers of an object for the micropatterning thereof, in particular for the lithographic micropatterning of electronic elements is disclosed. In one embodiment, at least one surface light modulator with an associated optical arrangement is irradiated by means of a light source and image fields. Individual structural elements, groups of structural elements or parts thereof are imaged with a predermined exposure dose on the light-sensitive layer in accordance with the respective driving state of the at least one surface light modulator, the predetermined exposure dose being divided between a plurality of exposure operations. The exposure dose for the individual exposure operations is chosen in such a way that, proceeding from a predetermined minimum exposure dose, the exposure dose is increased for each exposure operation compared with the respective preceding exposure operation. The exposure dose for the last exposure operation is more than 50% of the predetermined exposure dose.

DETAILED DESCRIPTION

In order to increase the writing speed, it is proposed according to this description to divide the total exposure dose (nominal exposure dose)—which is divided between a plurality of exposure operations—for the individual exposure operations in such a way that, proceeding from a predetermined minimum exposure dose, the exposure dose is increased for each exposure operation compared with the respective preceding exposure operation. In this case, according to the invention, the exposure dose for the last exposure operation is more than 50% of the nominal exposure dose. For this purpose, the method is advantageously configured in such a way that, proceeding from a predetermined minimum exposure dose, the exposure dose is in each case doubled from one exposure operation to the next. As a result, the entire exposure sequence which takes place in a plurality of exposure operations for producing a structural element, a group of structural elements or parts thereof satisfies the specification $dose_i = (2^{(i-1)}/2^{N-1}) * dose_{nominal}$. Within this specification, N denotes the total number of exposure operations for fabricating a structural element, a group of structural elements or parts thereof. The index i specifies the sequential number of the respective exposure operation, so that the $dose_i$ corresponds to the exposure dose or light intensity during the exposure operation with the sequential number i. The expression $dose_{nominal}$ corresponds to the nominal exposure dose.

In a departure from the practical implementation—already illustrated—of the exposure method known from the prior art, in the case of which the exposure dose, proceeding from the value of 50%, is halved with each exposure operation and the last exposure operation is repeated, the exposure dose is altered for each exposure operation in the case of one method according to the invention. In accordance with the exposure specification indicated, assuming a total of four exposure operations, an exposure dose of about 53% of the nominal exposure dose results for the last exposure operation.

Since a repeated exposure with the same exposure dose at the end of the entire exposure sequence is obviated, a reduction in the number of exposure operations by at least one is advantageously achieved. As a result, there is an overall increase in the writing speed of an exposure system operating according to this method. In the sense of the method of one embodiment of the invention, the imaging elements are preferably realized in accordance with the apparatus operating with a mirror chip as described in the prior art. However, the application of other possibilities for surface light modulation is also conceivable, of course.

Furthermore, one embodiment of the invention proposes using a plurality of surface light modulators oriented with respect to one another in order to increase the writing speed. In this case, the light signal emerging from a light source, in each case as a light flash, only ever impinges on one of the plurality of imaging elements, this being accomplished by means of a corresponding driving of shutters assigned to the imaging elements.

By means of the different imaging elements, in each case different image fields (partial images) are also imaged on the layer to be patterned.

Synchronizing the continuous movement of the substrate, which is situated on a positioning table and to which the layer to be patterned is applied, with the driving of the imaging elements and the light flashes has the effect that said partial images on the layer to be patterned do not lie one above the other, but rather one beside the other. At a predetermined repetition rate of the light flashes, the offset between the individual partial images is set by the speed of movement of the positioning table. The advantage of this procedure is to be seen in the fact that the repetition rate for the light flashes can be increased compared with the previously known method in accordance with the number of imaging elements used.

In this case, account is taken of the fact that an imaging element has a certain inertia during the driving and, accordingly, the repetition rate of the light flashes, for example when using a pulsed laser, may be significantly higher than the number of possible changeovers of the imaging element. The use of a plurality of imaging elements reduces this discrepancy between the possibilities resulting from the use of the laser and the inertia during the driving of the imaging elements.

If this procedure is then combined with the procedure which is explained in the introduction and leads to the saving of at least one exposure operation, then a further gain in speed results for the writing speed.

In principle, at least two possibilities are conceivable for the design of the method regime in the case of such a combination. The first possibility consists in firstly imaging all of the imaging elements onto the layer to be patterned with the same exposure dose. In this case, the speed of movement of the positioning table is set in such a way that the individual partial images lie precisely one beside the other. This operation is repeated until the entire area to be patterned on the substrate has been exposed. Afterward, the exposure dose is doubled for all of the imaging elements in accordance with the exposure specifications indicated and the entire area to be patterned on the substrate is exposed with this new exposure dose. This operation is repeated up to exposure with an exposure dose of somewhat more than 50% of the nominal exposure dose. The second possibility resulting from the combination of the proposed exposure specification and the use of a plurality of imaging elements consists in each imaging element being assigned precisely one exposure dose from the series of exposure doses that results in accordance with the proposed exposure specification.

In the case of this possibility, the speed of movement of the positioning table is set in such a way that the partial images exposed by a specific imaging element lie precisely one beside the other, while the partial images of different image elements overlap by an amount which results from the number of imaging elements and the repetition rate of the light flashes. What is achieved in this way is that the entire area to be patterned on the substrate may be exposed in a single exposure cycle.

The advantage of the first proposed possibility over the second is that the number of exposure operations to be carried out, which is determined by the prescribed address resolution, is independent of the number of imaging elements used for the exposure. In the case of the second proposed possibility, the maximum writing speed is achieved when the number of exposure doses necessary for achieving the required address resolution is equal to the number of imaging elements used or an integer multiple thereof.

For the generation of the light flashes, either a pulsed light source, preferably a laser, may be used or the light emitted from a light source may be chopped into individual light flashes by means of a mechanical, optical or electronic shutter.

Furthermore, in order to increase the image quality, a modification of the method known from the prior art is proposed in which a structural element is produced by joined-together image elements of the imaging element. The image regions are placed together in this way in an inventive manner such that the individual image fields which are in each case generated by the pixel structure of the imaging element partly overlap. In the region of overlap, the pixel pattern is in this case generated by a random-based algorithm.

In this way, smooth edges which generally exhibit errors due to the finite numerical aperture of the optical arrangement are not produced between the image fields. Rather, as it were, "frayed" edges are produced, as a result of which the overlapping image fields merge practically "seamlessly" with one another.

When the pixel pattern is generated by a random-based algorithm, secondary conditions may be taken into account, which are known prior to the generation of the pixel pattern. Such a secondary condition may be e.g. that at least a certain number of pixels are driven in the direction perpendicular to the edge between the overlapping image fields. Another second secondary condition may be that, in the region of overlap, a certain number of pixels or parts of a pixel are to be exposed doubly, i.e. these pixels are then exposed by both image fields.

In accordance with one method variant, moreover, the image accuracy is increased by virtue of the fact that the partial fields exposed by a specific imaging element on the layer to be patterned have an offset. Corresponding generation of the pixel pattern on the imaging element has the effect that each structure to be exposed is produced by different regions on the imaging element. Pixel errors (for example defects due to electrodes that cannot be driven in the pixel matrix) or errors caused by different optical properties of individual regions of the imaging element are avoided in this way.

In this case, the offset between the individual partial fields is expediently chosen in such a way that it is larger than the regions of the imaging element which are disturbed by pixel defects or by different optical properties of individual regions of the imaging element.

Any desired combination of the procedures described above is possible with regard to achieving the greatest possible advantages both in the case of increasing the writing speed and in the case of the image quality for the image fields (partial images) to be imaged.

The invention will be briefly explained again below with reference to a possible method regime produced according to it. In this case, the explanation is based on the following exemplary assumptions for producing a simple structure. The light source used is an Excimer laser having a wavelength of 248 nm. By means of three imaging elements, preferably in accordance with the configuration disclosed in WO 93/09472 a predetermined structure is intended to be transferred to an object with a light-sensitive layer in four exposure operations. The nominal exposure dose for the photoresist used f or patterningshall be 20 mJ/cm Each of the imaging elements is driven in a different way for generating a partial image of the structure to be produced on the light—sensitive layer. In this case, three different image fields respectively formed as pixel patterns are generated by means of a corresponding driving of the microelectrodes at the imaging elements.

Proceeding from the assumed nominal exposure dose, the three imaging elements are firstly illuminated with an intensity of 6.6% of said nominal exposure dose, that is to say of 1.33 mj/cm$^2$. As a result of the response of the shutters assigned to the imaging elements, the light flashes impinge on in each case a different one and in each case only one of the imaging elements and the pattern generated in accordance with its driving is transferred via the optical arrangement to the layer to be patterned. This operation is repeated until the entire area to be patterned on the substrate has been exposed.

The partial images generated by the individual imaging elements on the layer to be patterned do not lie exactly one beside the other, but rather have a region of overlap, the pixel pattern for said region of overlap having been generated on the basis of a random-based algorithm taking account of secondary conditions. After the exposure of the entire area to be patterned on the substrate, the exposure dose is increased to 13.3%, i.e. to 2.66 mJ/cm$^2$. The entire area to be patterned on the substrate is again exposed with this changed exposure dose.

In this case, the partial fields assigned to the individual imaging elements in the second exposure pass, relative to the partial fields generated in the first exposure pass, do not lie exactly one above the other, but rather have an offset which is larger than the regions on the imaging elements which are disturbed by pixel defects or different optical properties. In order to ensure that it is always exactly the same structure that is exposed, the offset is taken into account in the generation of the pixel pattern for the individual imaging elements. The next exposure operation is effected with a dose of 26.6%, i.e. 5.33 mJ/cm$^2$ Finally, the operation is concluded by exposing the entire area to be patterned on the substrate with an exposure dose of 53.3%, i.e. 10.66 mJ/cm$^2$.

The exposure sequence described improves the quality of the structures produced on the light—sensitive layer to the effect that regions on the individual imaging elements which are disturbed by pixel defects or different optical properties only contribute with a significance which is proportional to the exposure dose, and can thus amount at most to somewhat more than 50%, to the quality of the imaging of a specific structure.

The accuracy of placing together two adjacent partial images is improved by virtue of the fact that, firstly, "frayed" edges are exposed together. Secondly, the offset of the partial fields between the individual exposure passes has the effect that each structure which is produced by partial fields that are placed together in one exposure pass lies within a partial field in each further exposure operation and is thus not disturbed.

Finally, in the case of such a procedure, the area to be patterned on the substrate is exposed in a third of the time compared with the use of only one imaging element. Added to this is the gain in speed through the use of the proposed exposure specification for dividing the exposure dose.

What is claimed is:

1. A method for the maskless exposure of a light-sensitive layer of an object for the micropatterning thereof, comprising:

irradiating at least one surface light modulator with an associated optical arrangement by means of a light source and image fields;

imaging individual structural elements, groups of structural elements or parts thereof with a predetermined exposure dose on the light-sensitive layer in accordance with a respective driving state of the at least one surface light modulator, the predetermined exposure dose being divided between a plurality of exposure operations;

selecting an exposure dose for each of the plurality of exposure operations in such a way that, proceeding from a predetermined minimum exposure dose, the exposure dose is increased for each exposure operation compared with a respective preceding exposure operation, the exposure dose for a final exposure operation being more than 50% of the predetermined exposure dose.

2. The method as claimed in claim 1, characterized in that the exposure dose is in each case doubled from one exposure operation to the next and satisfies the specification $dose_i$ ($2^{(i-1)}/2^N-1$)*$dose_{nominal}$, where N corresponds to the total number of exposure operations, i corresponds to the sequential number of a respective exposure operation, $dose_i$ corresponds to the exposure dose during the exposure operation with the sequential number i and $dose_{nominal}$ corresponds to the predetermined exposure dose.

3. The method as claimed in claim 1 or 2, further comprising:

providing at least two surface light modulators;

modulating light only by a single surface light modulator by means of varying driving of shutters assigned to the surface light modulators; and imaging different image fields on the object by means of the surface light modulators, wherein said object and the light-sensitive layer of said object is moved continuously by means of an x-y table.

4. The method as claimed in claim 3, wherein light flashes from a pulsed light source are used as the light source.

5. The method as claimed in claim 3, wherein the light from the light source is intermittently blocked by means of a mechanical, optical or electrical shutter is used.

6. The method as claimed in claim 3, wherein at least two surface light modulators are imaged with the same exposure dose during an exposure operation.

7. The method as claimed in claim 1, wherein the partial images generated by a surface light modulator on the light-sensitive layer during the individual exposure operations have an offset which is compensated for by means of an adapted generation of a pixel pattern on the surface light modulator.

8. The method as claimed in claim 1, wherein at least one surface light modulator images on the light-sensitive layer pixel patterns as image elements, which are placed together in order to form image fields that overlap at least with regard to one pixel of the pixel patterns.

9. The method as claimed in claim 8, wherein the overlapping image fields in each case form composite pixel patterns which are generated in a randomly controlled fashion in a region of their overlap, so that a non-smooth transition is produced between the overlapping image fields with regard to the pixel patterns forming them.

10. The method as claimed in claim 5, wherein the light source is a laser operated in continuous-wave operation.

* * * * *

UNITED STATES PATENT AND TRADEMARK OFFICE
CERTIFICATE OF CORRECTION

PATENT NO. : 6,844,916 B2
DATED : January 18, 2005
INVENTOR(S) : Paufler et al.

It is certified that error appears in the above-identified patent and that said Letters Patent is hereby corrected as shown below:

Column 8,
Line 15, delete "is used".

Signed and Sealed this

Tenth Day of January, 2006

JON W. DUDAS
*Director of the United States Patent and Trademark Office*